United States Patent [19]
Sudo et al.

[11] Patent Number: 5,449,944
[45] Date of Patent: Sep. 12, 1995

[54] SEMICONDUCTOR INFRARED IMAGE PICKUP DEVICE AND METHOD OF FABRICATING THE SAME

[75] Inventors: Gen Sudo; Soichiro Hikida, both of Kawasaki, Japan

[73] Assignee: Fujitsu Limited, Kawasaki, Japan

[21] Appl. No.: 352,777

[22] Filed: Dec. 1, 1994

Related U.S. Application Data

[63] Continuation of Ser. No. 22,523, Feb. 25, 1993, abandoned, which is a continuation of Ser. No. 806,247, Dec. 31, 1991, abandoned.

[30] Foreign Application Priority Data

Dec. 19, 1990 [JP] Japan ................................ 2-403723

[51] Int. Cl.$^6$ ...................... H01L 23/48; H01L 29/40
[52] U.S. Cl. ................................. 257/446; 257/448
[58] Field of Search ............................. 257/446, 448

[56] References Cited

U.S. PATENT DOCUMENTS 4,972,244  11/1990  Buffer et al. ..................... 257/446

Primary Examiner—Sara W. Crane
Assistant Examiner—Stephen D. Meier
Attorney, Agent, or Firm—Staas & Halsey

[57] ABSTRACT

A semiconductor image pickup device comprises a photo-sensing substrate and a signal processing substrate, wherein the photo-sensing substrate further comprises a plurality of detector elements, and the signal processing substrate comprises a plurality of input diodes, each detector element being operatively connected to the respective input diode. The detector elements are isolated and light shielded from each other and further from the signal processing substrate by a light shield layer, and each detector element has an input port for incident rays on an input side of the photo-sensing substrate and has a surface region on the opposite side for outputting a signal to the input diode. The light shield layer of the invention comprises an insulation multilayer and a metal layer laminated in this order from the input side of the incident rays. The embodiments utilize a silicon nitride layer and zinc sulphide layer as the insulation multilayer.

11 Claims, 6 Drawing Sheets

SEMICONDUCTOR INFRARED IMAGE PICKUP DEVICE AND METHOD OF FABRICATING THE SAME

This application is a continuation of application Ser. No. 08/022,523, filed Feb. 25, 1993, now abandoned which is a continuation of Ser. No. 07/806,247 filed Dec. 31, 1991, now abandoned.

BACKGROUND OF THE INVENTION

1. Field of the Invention

The present invention relates to a semiconductor infrared detector, and more particularly to an infrared image pickup device comprising a plurality of infrared detector elements forming a photo-sensing substrate. The photo-sensing substrate of the invention provides a light shield layer specially prepared for optically isolating each detector element from adjacent detector elements and further isolating a signal processing substrate from the photo-sensing substrate. Therefore, the device is most suitable for an application in which high resolution is required.

2. Description of the Related Art

Many kinds of semiconductor materials are utilized as a photo-electric conversion element. Among them, semiconductor $Hg_{1-x}Cd_xTe$ is known to have a narrow bandgap and to be a suitable material for an infrared detector. In a semiconductor image pickup device, a plurality of detector elements are arranged either one-dimensionally in a line or two-dimensionally in a matrix. In recent years, in order to obtain a higher resolution of the image pickup device, a distance between adjacent detector elements has been made smaller, which results in causing noise or cross talk problems.

An existing exemplary semiconductor image pickup device having a high sensitivity is illustrated in FIG. 1. The device Utilizes photovoltaic infrared detectors of compound semiconductor $Hg_{1-x}Cd_xTe$. The device is composed of two main portions of a photo-sensing substrate 30 and a signal processing substrate 32, and two substrates 30 and 32 are connected together by a plurality of connecting rods 13 (generally called a bump) therebetween.

With regard to an actual structure of the photo-sensing substrate 30, a plurality of infrared detector elements 1 are formed and buried in a CdTe substrate 5. Each detector element 1 comprises a P-type region 6 of compound semiconductor $Hg_{1-x}Cd_xTe$ and an N-type region 7 of $Hg_{1-x}Cd_xTe$ buried therein. With regard to the signal processing substrate 32, a plurality of diodes 14 are formed in a P-type silicon substrate 4, and the diode 14 is formed by a buried N-type region and a surrounding P-type silicon substrate region. Each N-type region 7 of the photo-sensing substrate 30 and each diode 14 of the signal processing substrate 32 are connected with a bump 13 of indium (In). The P-type regions 6 of the photo-sensing substrate 30 are connected together by a metal wiring layer 12, which forms a common electrode of the detector elements 1.

In the infrared image pickup device of the prior art, no light shield (or light absorber) is provided around an isolation region 2 between the adjacent detector elements 1, therefore, incident rays having the direction shown by arrows A cause irregular reflections from interfaces or the metal wiring layer 12 on the photo-sensing substrate 30. Some of the infrared rays penetrate through the photo-sensing substrate 30 and reach the surface of the signal processing substrate 32, and are reflected back therefrom. The above reflected rays, so-called stray rays, enter into the nearby detector element 1 and sensed therein as noise. All these phenomena deteriorate an S/N ratio and the aimed resolution of infrared image pickup device can not be obtained.

In order to reduce the generation of needless stray rays and to avoid the cross talk problem, the following two Japanese Unexamined Patents have been disclosed.

Japanese Unexamined Patent Publication SHO 63-296272 published Dec. 2, 1988 discloses the method, which a metal layer of gold (Au) 12 is formed on the surface of a photo-sensing substrate 30 except the surface of an N-type region 7 of the detector elements 1, and a substantial portion of a CdTe substrate 5 is etched away, which reduces the noise problem and further eliminates a thermal trouble caused by a difference in thermal expansion between the CdTe substrate 5 and the silicon substrate 4.

Japanese Unexamined Patent Publication HEI 12-01971 published Aug. 14, 1989 discloses that a photo-sensing substrate 30 comprises a buffer layer and infrared detector elements are not buried in a photo-sensing substrate 30 but each detector element has a mesa shape which is formed on the buffer layer and protrudes toward signal processing substrate 32. The surface of an isolation region 2, in other words, the bottom surface between detector elements (mesas) is covered with a light shield layer. The light shield layer is composed of two layers, i.e., a first layer of zinc sulphide (ZnS) and a second layer of chromium (Cr).

SUMMARY OF THE INVENTION

It is an object of the present invention to provide a semiconductor image pickup device which has a high resolution by reducing stray rays.

A basic structure of a semiconductor image pickup device of the invention is similar to that applied in the prior art, namely, the device comprises a photo-sensing substrate and a signal processing substrate, in which the photo-sensing substrate comprises a plurality of detector elements and the signal processing substrate comprises a plurality of input diodes. Each detector element is operatively connected by a bump to the respective input diode of the signal processing substrate.

In accordance with the image pickup device of the present invention, the photo-sensing substrate is completely shielded from the signal processing substrate by a light shield layer, and further each detector element is isolated from each other as much as possible. In one embodiment, the photo-sensing substrate is covered by the shield layer except for an input port of the detector element for receiving incident rays, and more particularly, the light shield layer of the invention is composed of an insulation layer and a metal layer, and further the insulation layer is of a multi-layer structure composed of silicon nitride and zinc sulphide layers.

BRIEF DESCRIPTION OF THE DRAWINGS

Throughout the drawings, the same reference numerals designate and identify the same or similar parts.

DETAILED DESCRIPTION OF THE PREFERRED EMBODIMENTS

Figure 2:
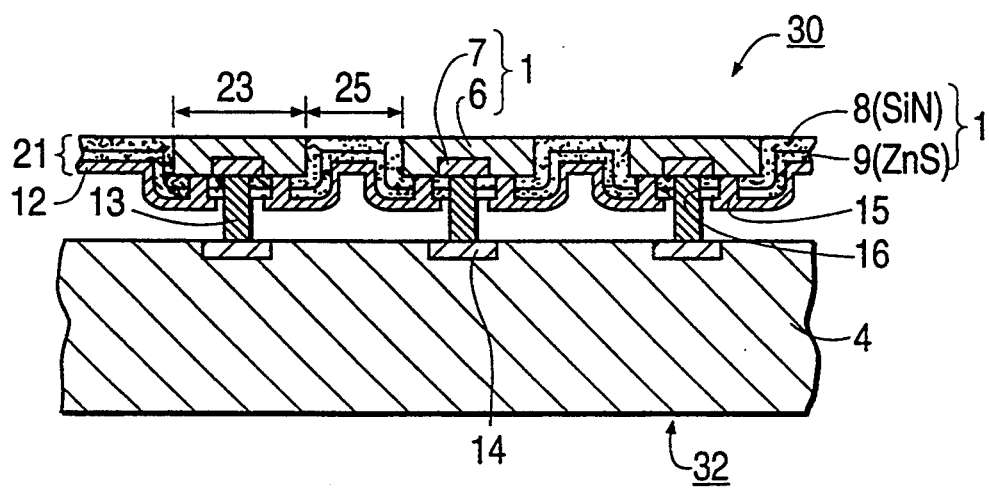
FIG. 2 shows a schematic cross section of a first embodiment of the present invention.

FIG. 2 shows a schematic cross section of a first embodiment of a semiconductor infrared image pickup device in accordance with the present invention. A plurality of detector elements 1 are arranged forming a main portion of a photo-sensing substrate 30. The detector element 1 comprises a P-type $Hg_{1-x}Cd_xTe$ crystalline region 6 and an N-type $Hg_{1-x}Cd_xTe$ region 7, which is formed by doping boron ion (B+) impurities into the P-type $Hg_{1-x}Cd_xTe$ region 6. Each detector element is insulated from neighboring detector elements by a double insulation layer 11 composed of a silicon nitride (SIN) layer 8 and a zinc sulphide (ZnS) layer 9

A metal layer 12 of aluminum (AL) covers the insulation layer 11. The metal layer 12 and the double insulation layer 11 form a light shield layer 21 of the present invention, and the shield layer 21 covers an outer surface of the P-type crystalline region 6 except a light input port 23. Holes 15 and 16 are formed through the insulation layer 11, and the metal layer 12 is in contact with the P-type crystalline region 6 through the hole 15, and a bump is formed through the hole 16.

A signal processing substrate 32 has a well known structure of a charge coupled device (CCD) using a silicon substrate, therefore, details thereof are omitted and only an input diode 14 is shown in FIG. 2.

The photo-sensing substrate 30 is assembled with the signal processing substrate 32 using a bump 13 and forms a completed infrared image pickup device of the invention. The bump 13 is made of indium (In) and connects the N-type $Hg_{1-x}Cd_xTe$ region 7 to the input diode 14. In the actual fabrication, resin (not shown) is further added in the space between the photo-sensing substrate 30 and the signal processing substrate 32.

Figure 3:
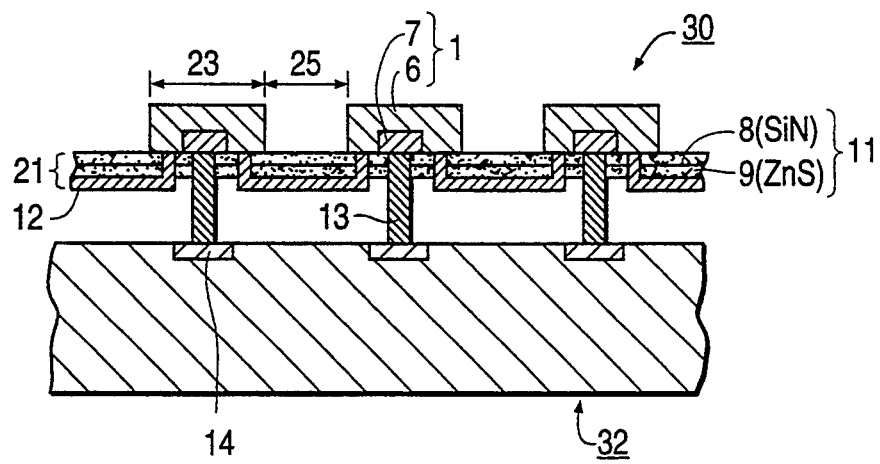
FIG. 3 shows a schematic cross section of a second embodiment of the present invention.

FIG. 3 shows a schematic cross section of a second embodiment of a semiconductor infrared image pickup device in accordance with the present invention. A photo-sensing substrate 30 is different from the photo-sensing substrate 30 of FIG. 2 In that a plurality of infrared detector elements 1 are isolated from each other and protruding on a flat light shield layer 21 forming isles. A signal processing substrate 32 and connecting bumps 13 are the same as those shown in FIG. 2. The light shield layer 21 is composed of a silicon nitride (SIN) layer 8, a zinc sulphide (ZnS) layer 9 and a metal layer 12 of aluminum, laminated in this order from the light input side.

When the infrared image pickup device of FIGS. 2 and 3 receives infrared rays, a photo-electromotive force is induced in each detector element 1 of the photo-sensing substrate 30. Incident infrared rays to each light input port 23 induce photo-electromotive force in the respective detector element. Each detector element of FIG. 2 is insulated and optically isolated from the neighboring detector elements by the light shield layer 21, and each detector element of FIG. 3 is completely separated from the neighboring elements, therefore, stray rays of the prior art which flow into the nearby detector element and cause deterioration of resolution can be avoided.

Infrared rays which are incident to a region 25 which occupies the boundary region between adjacent light input ports 23, penetrate into the SiN layer 8 and ZnS layer 9 of the insulation layer 11, are thereby partly attenuated and reflected, and are finally reflected from the metal layer 12. The incident rays and the reflected rays cause a complex interference with each other, and an apparent overall reflectance of the light shield layer 21 is remarkably reduced if proper thickness and refraction index are utilized for each layer of the insulation layer 11. It is preferable that refraction index $n_1$ of the first layer is less than refraction index $n_2$ of the second layer in order to reduce reflection. In the embodiment, $n_1$ of the SiN layer (approx. 2.0) is less than $n_2$ of the ZnS layer (approx. 2.2). Generally, the materials used for the insulation layer need to satisfy the following relation;

$$n_2 > n_1 > n_0,$$

herein $n_0$ denotes the refraction index of air which is equal to 1.

Figure 4:
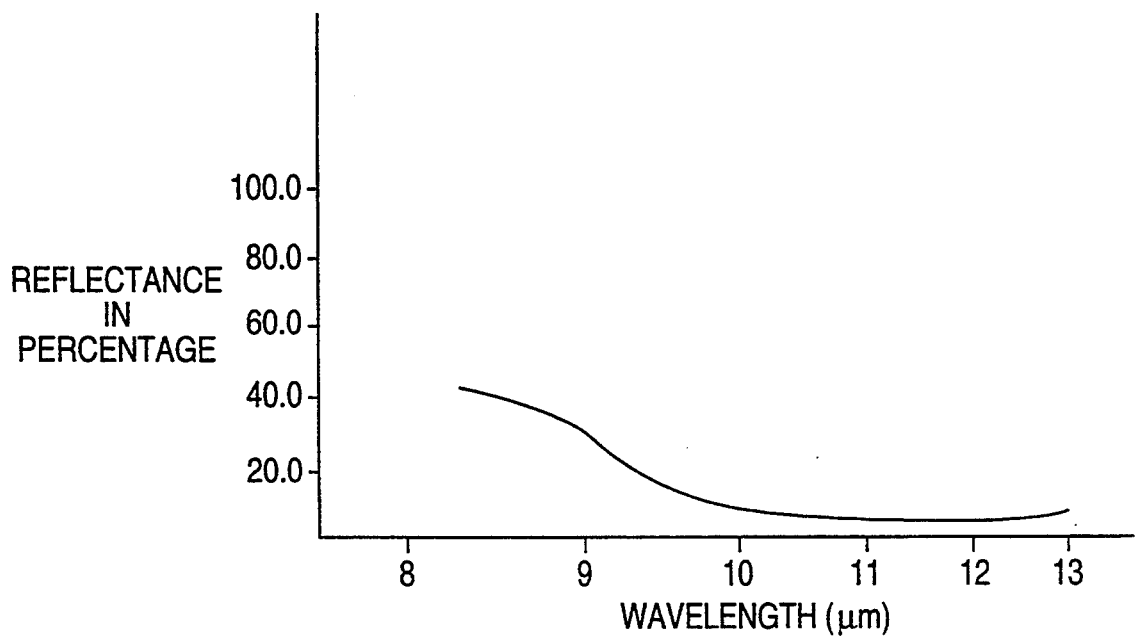
FIG. 4 is a graph showing relations between reflectance (in percentage) and incident light wavelength onto a light shield layer of the present invention.

The effect of the light shield layer 21 is tested using the insulation layer 11 formed on the aluminum layer 12, in which the insulation layer is of the SIN layer 8 having 400 nm in thickness and the ZnS layer 9 having 1 $\mu$m in thickness. A reflectance therefrom is measured by changing wavelength of the incident light, the results are shown in FIG. 4. Reflectance less than 5% can be obtained for a wavelength range of 10 to 12 $\mu$m.

In the embodiments of FIGS. 2 and 3, incident rays onto the region 23 cause extremely small effect to the adjacent detector elements 1 due to small reflection from the light shield layer 21. Further, incident rays can not penetrate through the light shield layer 21 due to the existence of the metal layer 12. Therefore, stray rays not exist between the photo-sensing substrate 30 and the signal processing substrate 32.

Figure 1:
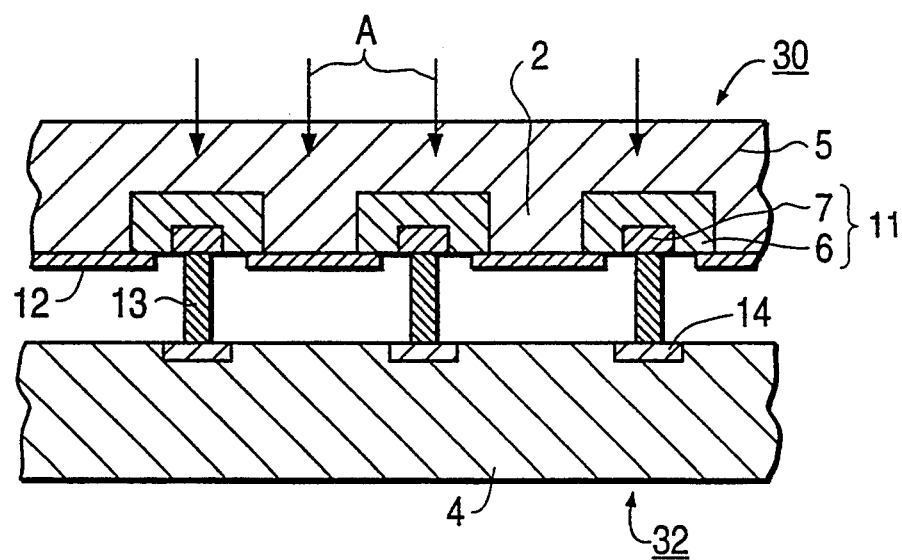
FIG. 1 shows a schematic cross section of a semiconductor image pickup device of the prior art.

Next, fabrication methods of the first and second embodiments are explained, in which all figures are illustrated upside-down compared with FIGS. 1 to 3 for the purpose of convenience.

Figure 5A:
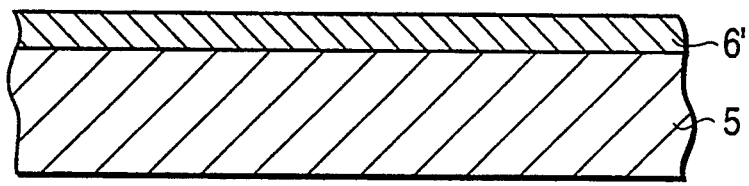
FIGS. 5(a), 5(b), 5(c), 5(d) and 5(e) show cross sections at sequential steps in fabrication of the first embodiment of the present invention.
Figure 5B:
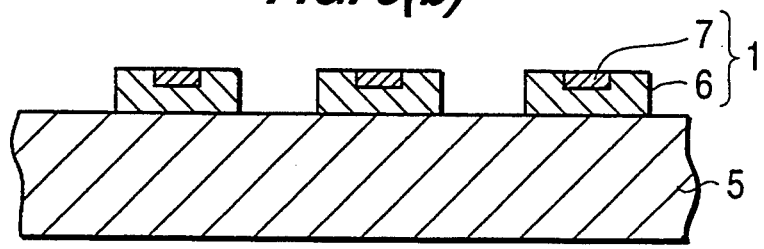

With regard to the fabrication of the first embodiment of FIG. 2, a P-type $Hg_{1-x}Cd_xTe$ 6' is grown epitaxially on a CdTe substrate 5 as shown in FIG. 5(a) by a vapor-phase or liquid-phase method, the thickness thereof being selected to be about 30 $\mu$m. Forming a resist layer (not shown) on the $Hg_{1-x}Cd_xTe$ layer 6', the substrate is subjected to a plasma etching process or an ion milling process, resulting in forming an isle-like mono-crystalline $Hg_{1-x}Cd_xTe$ region 6 of FIG. 5(b). After forming another resist mask (not shown), boron ions (B+) are implanted into the $Hg_{1-x}Cd_xTe$ region 6 forming an N-type $Hg_{1-x}Cd_xTe$ region 7, which results in forming a detector element 1.

Figure 5C:
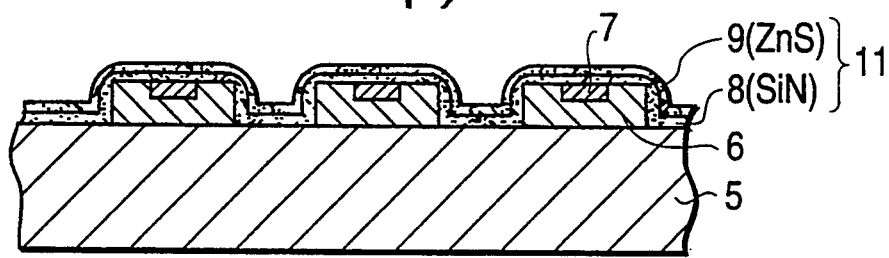

In FIG. 5(c), the entire surface of the substrate is deposited with a SiN layer 8 of about 0.4 $\mu$m in thickness by a CVD method, preferably, ECR (Electron Cyclotron Resonance) plasma CVD method. Thereafter the entire SiN surface is deposited with a ZnS layer 9 of about 1.0 $\mu$m in thickness by a vacuum sputtering method. Two layers of SiN 8 and ZnS 9 form an insulation layer 11 of the present invention.

Figure 5D:
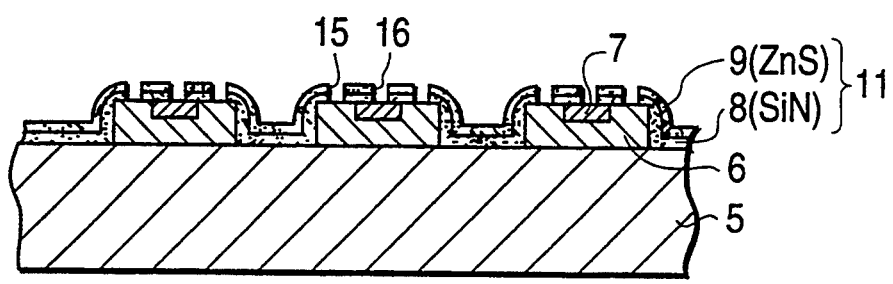

In FIG. 5(d), the insulation layer 11 is selectively patterned with the result of forming contact holes 15 and 16 for the P-type $Hg_{1-x}Cd_xTe$ region 6 and the N-type $Hg_{1-x}Cd_xTe$ region 7 respectively. The contact hole 15 is deposited and buried with gold (Au) and the contact hole 16 is deposited with indium (In) by a deposition method.

Figure 5E:
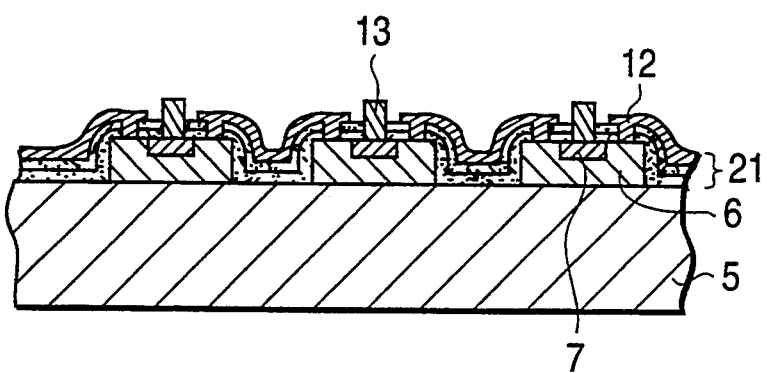

Next, in FIG. 5(e), a metal layer 12 of aluminum (Al) is selectively deposited on the insulation layer 11, to form a contact between the metal layer 12 and the buried Au in the contact hole 15. An indium bump 13 is grown above the N-type $Hg_{1-x}Cd_xTe$ region 7, and thereafter a signal processing substrate 39 which is separately fabricated, is fixed using resin material such that the bump 13 is in contact with an input diode 14 of the signal processing substrate 32. Finally, the CdTe substrate 5 is removed by etching, completing fabrication of the image pickup device of FIG. 2 of the invention.

Figure 6A:
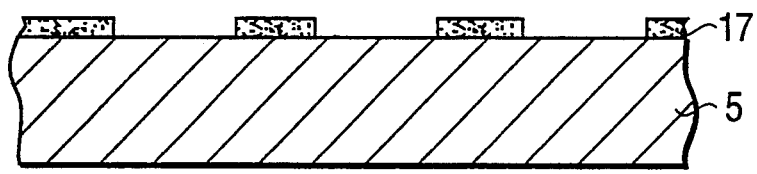
FIGS. 6(a), 6(b), 6(c), 6(d), 6(e) and 6(f) show cross sections at sequential steps in fabrication of the second embodiment of the present invention.
Figure 6B:
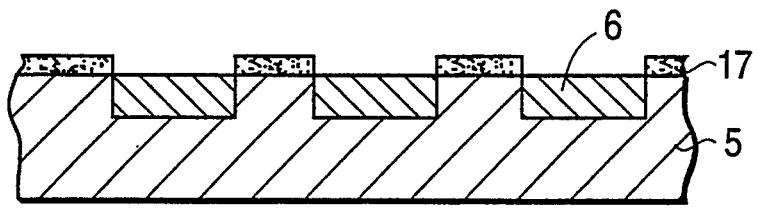

Next, a fabrication method of the second embodiment of FIG. 3 is explained. In FIG. 6(a), a silicon dioxide ($SiO_2$) layer 17 is formed on a CdTe substrate 5 by a CVD method and $SiO_2$ layer 17 patterned. Using the $SiO_2$ layer 17 as a mask, the CdTe substrate 5 is exposed to the ambient conditions of Te-rich $Hg_{1-x}Cd_xTe$ melt and the temperature of the substrate 5 is kept at about 550° C. for a predetermined time. This process results in forming a buried P-type $Hg_{1-x}Cd_xTe$ region 6 in the CdTe substrate 5 as shown in FIG. 6(b).

Figure 6C:
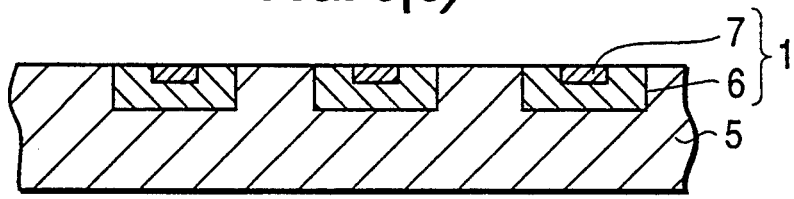

After removing $SiO_2$ mask 17, a resist mask is formed and patterned (not shown) on the substrate. Boron ions are implanted forming an N-type $Hg_{1-x}Cd_xTe$ region 7 as shown in FIG. 6(c). A PN junction is formed between P-type $Hg_{1-x}Cd_xTe$ region 6 and the N-type $Hg_{1-x}Cd_xTe$ region 7, and both regions form a detector element 1.

Figure 6D:
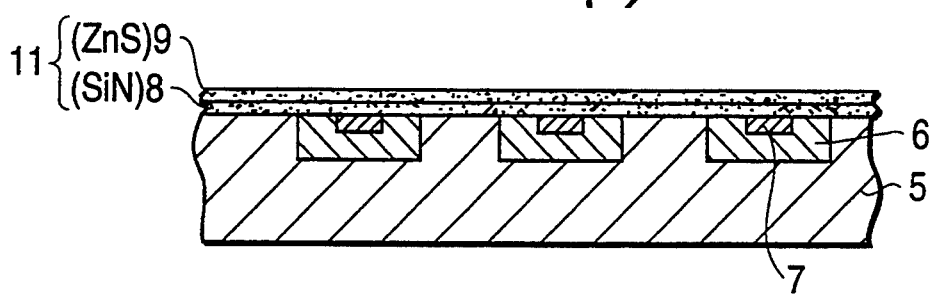

In FIG. 6(d), a SiN layer 8 having a thickness of about 0.4 μm is formed on the entire substrate and thereafter a ZnS layer 9 having a thickness of about 1.0 μm is formed thereon in the similar way as in the first embodiment.

Figure 6E:
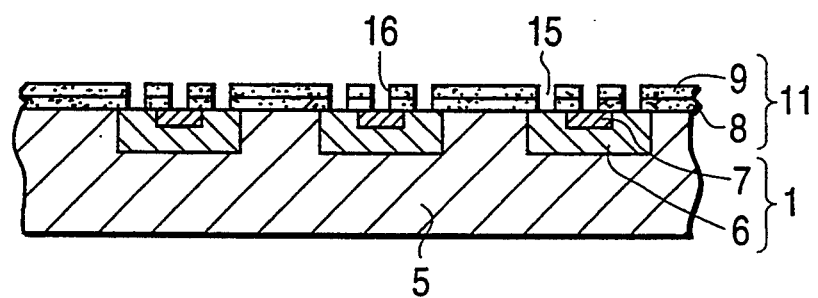
Figure 6F:
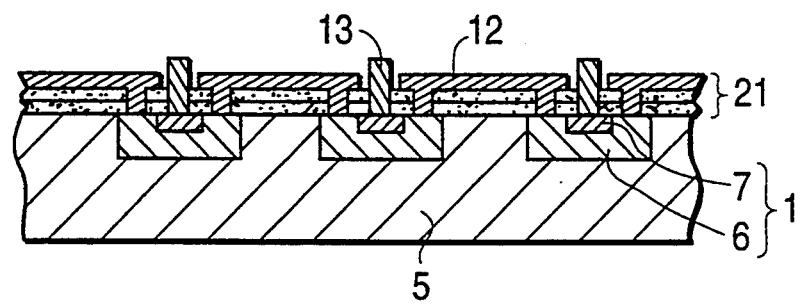

The subsequent processes are completely the same as applied for the first embodiment, therefore the details are omitted. In FIG. 6(e), contact holes 15 and 16 are formed. In FIG. 6(f), a metal layer 12 and a bump 13 are formed. After the photo-sensing substrate 30 thus fabricated is assembled with a signal processing substrate 32, the CdTe substrate 5 is removed. Fabrication of the image pickup device of FIG. 3 of the present invention is finished.

The present invention may be embodied in other specific forms. The presently disclosed embodiments are, therefore, to be considered in all respects as illustrative and not restrictive, the scope of the invention being indicated by the appended claims, rather than the foregoing description, all changes which come within the meaning and range of equivalence of the are, therefore, to be embraced therein.

What is claimed is:

1. A semiconductor image pickup device comprising:
 a signal processing substrate including a plurality of input diodes; and
 a photo-sensing substrate including
 a plurality of detector elements separated from each other, each detector element having a first region providing an input port for incident rays on an input side of said photo-sensing substrate and having a second region at a bottom surface on an opposite side of said photo-sensing substrate facing said signal processing substrate, the second region coupled to a respective one of said input diodes for outputting a detected signal to the respective one of said input diodes, and
 a light shield layer formed on the opposite side of said photo-sensing substrate and supporting said detector elements at least on a portion of the bottom surface thereof, said light shield layer including an insulation multilayer and a metal layer laminated in this order on the opposite side of said photo-sensing substrate, said metal layer connected to the first region of each of said detector elements.

2. A semiconductor image pickup device as recited in claim 1, wherein said insulation multilayer includes a plurality of insulation layers, each insulation layer having a different refractive index.

3. A semiconductor image pickup device as recited in claim 2, wherein said insulation multilayer includes a silicon nitride layer and a zinc sulphide layer laminated in this order from said input side of the photo-sensing substrate.

4. A semiconductor image pickup device as recited in claim 2, wherein said insulation multilayer includes first and second insulation layers, a refractive index of the second insulation layer on the metal layer side being greater than a refractive index of the first insulation layer.

5. A semiconductor image pickup device as recited in claim 1,
 wherein each of said detector elements further has sidewalls,
 wherein said light shield layer has a shape such that the sidewalls and the bottom surface of each of said detector elements are enclosed by said light shield layer with both said insulation multilayer and said metal layer covering the sidewalls, and
 wherein said input ports of said detector elements and said light shield layer between adjacent detector elements form a substantially flat surface on the input side of said photo-sensing substrate.

6. A semiconductor image pickup device as recited in claim 5, wherein the first region in each of said detector elements has a first conductivity type and the second region has a second conductivity type opposite to the first conductivity type.

7. A semiconductor image pickup device as recited in claim 6, wherein a semiconductor material of said detector elements is $Hg_{1-x}Cd_xTe$.

8. A semiconductor image pickup device as recited in claim 1, wherein said light shield layer forms a substantially flat surface, each of said detector elements being disposed on said light shield layer in isolation from each other.

9. A semiconductor image pickup device as recited in claim 8, wherein the first region in each of said detector elements has a first conductivity type and the second region has a second conductivity type opposite to the first conductivity type.

10. A semiconductor image pickup device as recited in claim 9, wherein a semiconductor material of said detector elements is $Hg_{1-x}Cd_xTe$.

11. A semiconductor image pickup device as recited in claim 1,
 wherein the second region of each of said detector elements is coupled to a respective one of said input diodes by a connector, and
 wherein said metal layer is physically and electrically separated from said connector.

* * * * *

UNITED STATES PATENT AND TRADEMARK OFFICE
CERTIFICATE OF CORRECTION

PATENT NO. : 5,449,944

DATED : September 12, 1995

INVENTOR(S) : Sudo et al.

It is certified that error appears in the above-indentified patent and that said Letters Patent is hereby corrected as shown below:

Cover Page, [63], "Dec. 31," should be --Dec. 13,--.

Col. 1, line 9, "Dec. 31," should be --Dec. 13,--.

Col. 1, line 38, "Utilizes" should be --utilizes--.

Col. 2, line 11, "method," should be --method, in--;
line 21, "12-01971" should be --1-201971--.

Col. 3, line 21, "element" should be --element 1--;
line 23, "(SIN)" should be --(SiN)--;
line 49, "In" should be --in--;
line 55, "(SIN)" should be --(SiN)--.

Col. 4, line 27, "SIN" should be --SiN--;
line 38, "rays" should be --rays can--.

Col. 5, line 19, "17" should be --17 is--;
line 54, "the are," should be --the claims are,--.

Col. 6, line 4, "said" (second occurrence) should be --each of said--.

Signed and Sealed this

Twenty-seventh Day of February, 1996

Attest:

BRUCE LEHMAN

Attesting Officer        Commissioner of Patents and Trademarks